(12) United States Patent
Tang

(10) Patent No.: US 11,862,516 B2
(45) Date of Patent: Jan. 2, 2024

(54) SEMICONDUCTOR STRUCTURE MANUFACTURING METHOD

(71) Applicant: CHANGXIN MEMORY TECHNOLOGIES, INC., Hefei (CN)

(72) Inventor: Huiwen Tang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 182 days.

(21) Appl. No.: 17/480,365

(22) Filed: Sep. 21, 2021

(65) Prior Publication Data

US 2022/0122882 A1 Apr. 21, 2022

Related U.S. Application Data

(63) Continuation of application No. PCT/CN2021/107371, filed on Jul. 20, 2021.

(30) Foreign Application Priority Data

Oct. 15, 2020 (CN) .......................... 202011101827.3

(51) Int. Cl.
*H01L 21/768* (2006.01)
*H01L 21/285* (2006.01)

(52) U.S. Cl.
CPC .. *H01L 21/76867* (2013.01); *H01L 21/28556* (2013.01); *H01L 21/76864* (2013.01)

(58) Field of Classification Search
None
See application file for complete search history.

(56) References Cited

U.S. PATENT DOCUMENTS 7,718,527 B2 5/2010 Ishizaka et al.
2002/0187631 A1* 12/2002 Kim .................. H01L 21/76858
438/668

(Continued)

FOREIGN PATENT DOCUMENTS

CN 102142428 A 8/2011
CN 102201457 A 9/2011
(Continued)

OTHER PUBLICATIONS

Wolf and Tauber, § 8.12.8 entitled "Rapid Thermal Processing" in Silicon Processing for the VLSI Era, vol. 1: Process Technology, 2nd Ed., Sunset Beach, CA: Lattice Press, 2000, pp. 308-310 (Year: 2000).*

(Continued)

*Primary Examiner* — Erik Kielin
(74) *Attorney, Agent, or Firm* — Cooper Legal Group, LLC

(57) ABSTRACT

A semiconductor structure manufacturing method according to the embodiments of the present application includes the following steps of: providing a semiconductor substrate; forming a first reaction layer on the semiconductor substrate; forming a second reaction layer on the first reaction layer; and thermally reacting at least a portion of the first reaction layer with at least a portion of the second reaction layer, to form an amorphous diffusion barrier layer. This amorphous diffusion barrier layer is an amorphous body with no grain boundary therein. As a result, the diffusion path for metal atoms is cut off, thereby improving the barrier effect of the barrier layer efficiently and solving the circuit performance issue caused by metal atom diffusion.

10 Claims, 7 Drawing Sheets

(56) References Cited

U.S. PATENT DOCUMENTS

| | | | | |
|---|---|---|---|---|
| 2008/0237859 A1* | 10/2008 | Ishizaka | ............ | H01L 21/76843 |
| | | | | 438/643 |
| 2009/0246952 A1* | 10/2009 | Ishizaka | ............ | H01L 21/76843 |
| | | | | 438/653 |
| 2010/0052168 A1 | 3/2010 | Jung et al. | | |
| 2016/0163588 A1* | 6/2016 | Kim | .................. | H01L 21/76843 |
| | | | | 438/653 |
| 2021/0313145 A1* | 10/2021 | Rayner, Jr. | ........ | C23C 16/45544 |

FOREIGN PATENT DOCUMENTS

| | | | |
|---|---|---|---|
| KR | 20090075499 A | | 7/2009 |
| KR | 20090075501 A | | 7/2009 |

OTHER PUBLICATIONS

Atomic Volume of Cobalt from the Periodic Table of the Elements (Year: 1962).*
Corresponding PCT Patent Application No. PCT/CN2021/107371, International Search Report dated Oct. 20, 2021.

\* cited by examiner

SEMICONDUCTOR STRUCTURE MANUFACTURING METHOD

CROSS-REFERENCE TO RELATED APPLICATIONS

This application is a continuation application of International Patent Application No. PCT/CN2020/107371, filed on Jul. 20, 2021, which claims priority to Chinese Patent Application No. 202011101827.3, filed with the Chinese Patent Office on Oct. 15, 2020 and entitled "SEMICONDUCTOR STRUCTURE MANUFACTURING METHOD". International Patent Application No. PCT/CN2020/107371 and Chinese Patent Application No. 202011101827.3 are incorporated herein by reference in their entireties.

TECHNICAL FIELD

The present application generally relates to the field of semiconductor technologies, and in particular to a semiconductor structure manufacturing method.

BACKGROUND

Rapid growth has been witnessed in the industry of semiconductor integrated circuits. In the course of the evolution of integrated circuits, an increase in device performance is usually accompanied by a decrease in device area or an increase in device density. However, as the geometric dimension of integrated circuit devices continues to shrink, a barrier layer cannot block the diffusion of a metal layer towards a substrate in a better way, which adversely affects the circuit performances.

SUMMARY

The semiconductor structure manufacturing method according to the embodiments of the present application can form an amorphous diffusion barrier layer that effectively blocks the diffusion of a metal layer towards a substrate.

The semiconductor structure manufacturing method according to the embodiments of the present application includes the following steps of:

providing a semiconductor substrate;

forming a first reaction layer on the semiconductor substrate;

forming a second reaction layer on the first reaction layer; and thermally reacting at least a portion of the first reaction layer with at least a portion of the second reaction layer, to form an amorphous diffusion barrier layer.

The semiconductor structure manufacturing method according to the embodiments of the present application includes the following steps of:

providing a semiconductor substrate;

forming a plurality of first reaction layers and a plurality of second reaction layers on the semiconductor substrate, the plurality of first reaction layers and the plurality of second reaction layers being alternately arranged;

thermally reacting at least a portion of the adjacent first reaction layer with at least a portion of the adjacent second reaction layer, to form an amorphous diffusion barrier layer between each of the adjacent first reaction layers and each of the adjacent second reaction layers; and forming a conductive layer on the uppermost layer of the plurality of first reaction layers and the plurality of second reaction layers.

BRIEF DESCRIPTION OF DRAWINGS

The above and other features and advantages of the present application will become more apparent from the detailed description of the exemplary implementations of the present application with reference to the accompanying drawings.

Figure 1:
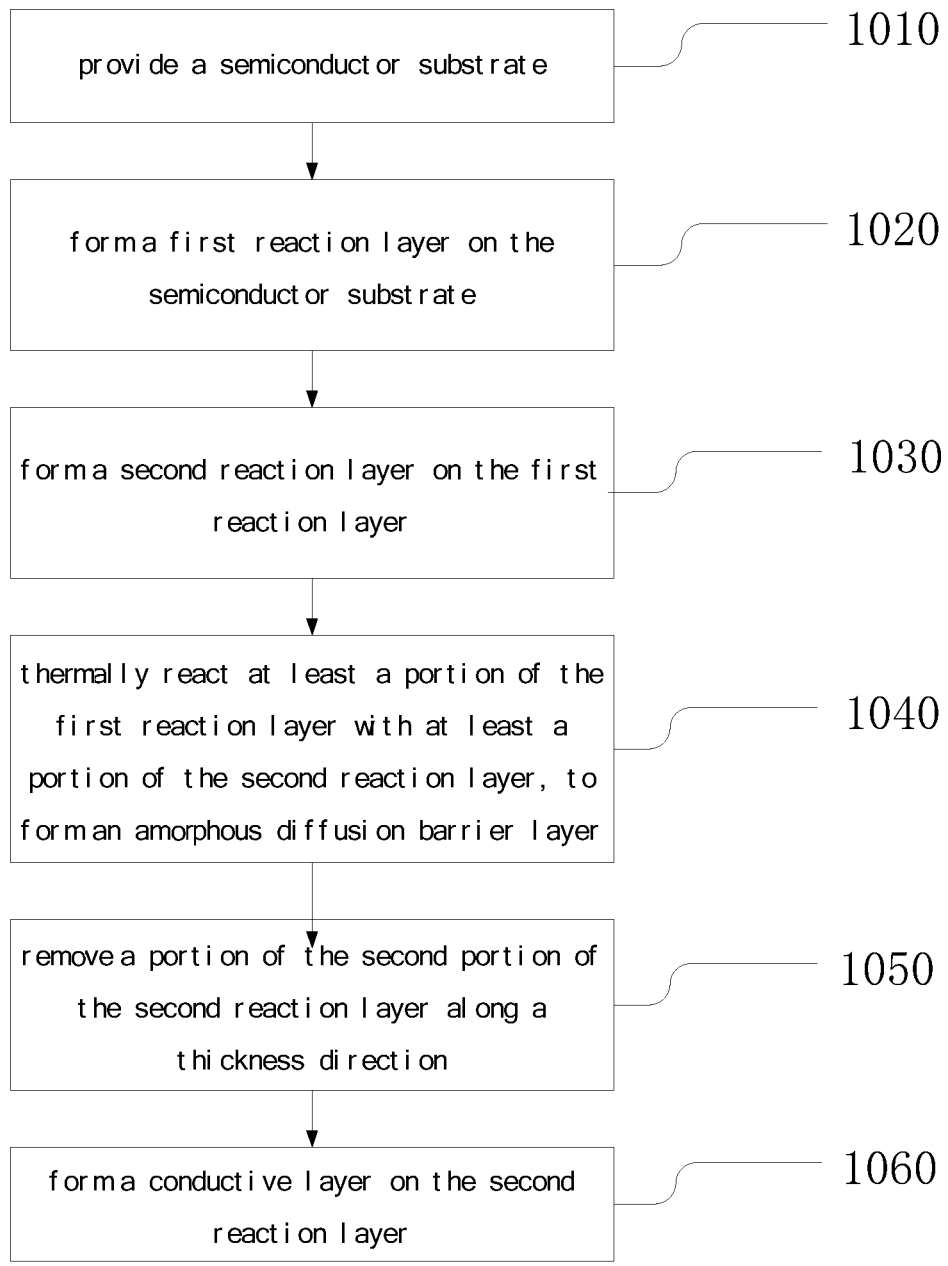
FIG. 1 illustrates a flow chart of the semiconductor structure manufacturing method according to an embodiment of the present application.

REFERENCE NUMERALS 100 semiconductor substrate;
200 first reaction layer;
210 first portion;
220 second portion;
300 second reaction layer;
310 first portion;
320 second portion;
321 portion;
322 remaining portion;
400 amorphous diffusion barrier layer;
500 conductive layer.

DESCRIPTION OF EMBODIMENTS

The exemplary implementations will now be described more fully with reference to the accompanying drawings. However, the exemplary implementations can be implemented in a variety of forms and should not be construed as limited to the implementations set forth herein. Rather, these implementations are provided so that the present application will be thorough and complete and will fully convey the concepts of the exemplary implementations to those skilled in the art. Throughout the drawings, the same reference signs indicate the same or similar structures, and their detailed description will be omitted.

The barrier layer is commonly used in semiconductor structures. For instance, the barrier layer may surround a fin structure, be in a contact opening, be in a metal gate, be in a metal interconnecting structure, and be among a plurality of gate layers. The barrier layer can avoid the situation where unwanted diffusions occur since the material penetrates into other layers. In general, the commonly used barrier layer is made of a crystalline material. However, owing to the presence of grain boundaries in the crystal, metal atoms of a metal layer are prone to diffusion towards other layers (such as semiconductor substrate) along the grain boundaries, which therefore adversely affects the circuit performances.

On this basis, the embodiments of the present application propose a semiconductor structure manufacturing method, in which the first and second reaction layers are formed respectively on the semiconductor substrate and then undergo a thermal reaction to form an amorphous diffusion barrier layer between the first and second reaction layers. This amorphous diffusion barrier layer is an amorphous body with no grain boundary therein. As a result, the diffusion path for metal atoms is cut off, thereby improving the barrier effect of the barrier layer efficiently and solving the circuit performance issue caused by metal atom diffusion.

In addition, after the amorphous diffusion barrier layer is formed by the thermal reaction, the second reaction layer has not fully reacted with the first reaction layer, and there is still an unreacted region on the upper portion of the second reaction layer. Without varying the thickness of the amorphous diffusion barrier layer, the thicknesses of the first reaction layer and the second reaction layer can be effectively decreased by removing a part of the unreacted region of the second reaction layer. This further contributes to reducing the critical size of the semiconductor device.

According to the embodiments of the present application, any suitable semiconductor devices for the barrier layer may be used, e.g., complementary metal oxide semiconductor field effect transistors, complementary metal oxide semiconductor devices, p-type metal oxide semiconductor devices, n-type metal oxide semiconductor devices, fin field effect transistors, fully-wound gate metal oxide semiconductor field effect transistors such as nanowire devices or nanosheet devices, or other multi-gate field effect transistors. The semiconductor device may be manufactured when an integrated circuit or portions thereof (which may include static random access memory and/or logic circuits, passive components such as resistors, capacitors or inductors, and active components such as p-type field effect transistors, n-type field effect transistors, fin field effect transistors, complementary metal oxide semiconductor field effect transistors, complementary metal oxide semiconductor transistors, bipolar transistors, high-voltage transistors, high-frequency transistors, other memory cells, or combinations of the above) are processed.

As shown in FIG. 1 to FIG. 7, FIG. 1 illustrates a flow chart of the semiconductor structure manufacturing method according to an embodiment of the present application, and FIG. 2 to FIG. 7 illustrate sectional diagrams of different process stages of the semiconductor structure manufacturing method according to an embodiment of the present application.

Figure 2:
FIG. 2 to FIG. 7 illustrate sectional diagrams of different process stages of the semiconductor structure manufacturing method according to an embodiment of the present application.

As shown in the step 1010 of FIG. 1 and in FIG. 2, a semiconductor substrate 100 is provided. The semiconductor substrate 100 may be a plane (planar metal gate) as shown in the drawing, and may be of a trench type (buried wordline) or hole type structure (metal interconnecting structure). The semiconductor substrate 100 includes a semiconductor material such as matrix silicon or monocrystalline silicon. In other embodiments or additional embodiments, the semiconductor substrate 100 may include another semiconductor element, such as germanium with a crystalline structure. The semiconductor substrate 100 may also include semiconductor compounds, such as silicon germanium, silicon carbide, gallium arsenide, gallium phosphide, indium phosphide, indium arsenide, indium antimonide, or combinations thereof. The semiconductor substrate 100 may also include a semiconductor-on-insulator substrate 100, such as silicon-on-insulator substrate, silicon germanium-on-insulator substrate, or germanium-on-insulator substrate.

In some embodiments, the semiconductor substrate 100 is a bulk semiconductor substrate 100, e.g., semiconductor wafer. For example, the semiconductor substrate 100 includes a semiconductor material of silicon or other elements, e.g., germanium. The semiconductor substrate 100 may be doped (e.g., P-type, N-type, or combinations of the above) or undoped. In some embodiments, the semiconductor substrate 100 includes a semiconductor layer growing epitaxially on a dielectric layer. The epitaxially growing semiconductor layer may be made of silicon germanium, silicon, germanium, one or more other suitable materials, or combinations of the above.

In some other embodiments, the semiconductor substrate 100 includes a compound semiconductor. For example, the compound semiconductor includes one or more Group III-V compound semiconductors having a composition as defined in the formula $Al_{x1}Ga_{x2}In_{x3}As_{y1}P_{y2}N_{y3}Sb_{y4}$, where X1, X2, X3, Y1, Y2, Y3 and Y4 represent relative proportions. They are each more than or equal to 0, and their sum is equal to 1. The compound semiconductor may include silicon carbide, gallium arsenide, indium arsenide, indium phosphide, one or more other suitable compound semiconductors, or combinations of the above. Other suitable substrates including Group II-VI compound semiconductors may also be used.

In some embodiments, the semiconductor substrate 100 is an active layer of a semiconductor-on-insulator (SOI) substrate. The manufacturing of the SOI substrate may be achieved using a separation by implantation of oxygen (SIMOX) process, a wafer bonding process, other suitable processes, or combinations of the above. In some other embodiments, the semiconductor substrate 100 includes a multilayer structure. For instance, the semiconductor substrate 100 includes a silicon germanium layer formed on a bulk silicon layer.

Figure 3:
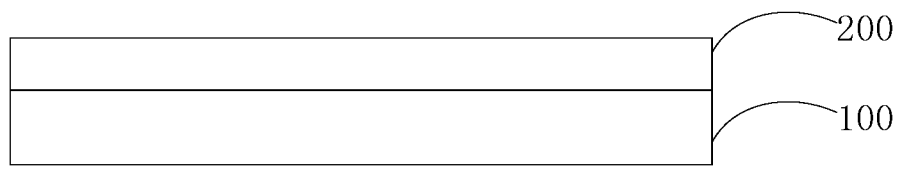

As shown in the step 1020 of FIG. 1 and in FIG. 3, a first reaction layer 200 is formed on the semiconductor substrate 100. In some implementations, the first reaction layer 200 is made of a metal compound material. In some implementations, the above metal compound material may include titanium nitride (TiN), tantalum nitride (TaN), titanium carbonitride (TiCN), or tantalum carbonitride (TaCN).

In an implementation, when titanium nitride (TiN) is formed on the semiconductor substrate 100, atomic layer deposition, chemical vapor deposition, plasma-assisted chemical vapor deposition, physical vapor deposition (PVD), electroplating, electroless plating, one or more other suitable processes, or combinations of the above may be used to deposit a TiN layer on the semiconductor substrate 100.

In some implementations, the physical vapor deposition process is utilized to deposit the TiN layer on the semiconductor substrate 100, and the reaction gas for TiN may be $TiCl_4$ and $NH_3$.

In an implementation, the first reaction layer 200 may have a thickness ranging from 10 nm to 50 nm, e.g., 20 nm, 25 nm, 30 nm, 35 nm, 40 nm, 45 nm, etc.

Figure 4:
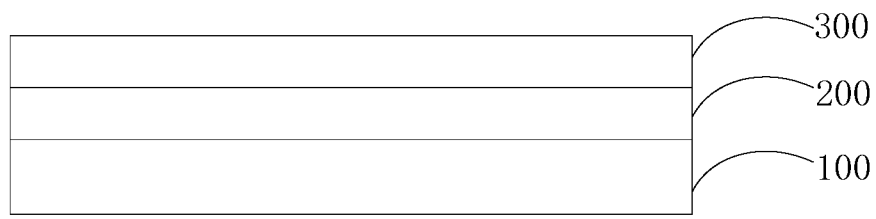

As shown in the step 1030 of FIG. 1 and in FIG. 4, a second reaction layer 300 is formed on the first reaction layer 200. In some implementations, the second reaction layer 300 is made of a metal conductive material, which may be cobalt (Co), molybdenum (Mo), tungsten (W) or iridium (Ir), or combinations thereof.

In an implementation, formation of a cobalt layer on the first reaction layer 200 may be achieved using chemical vapor deposition, atomic layer deposition, physical vapor deposition, plasma-assisted chemical vapor deposition, electroplating, electroless plating, spin coating, one or more other suitable processes, or combinations of the above.

In some implementations, when the physical vapor deposition process is employed to deposit Co on the first reaction layer 200, dicobalt hexacarbonyl butylacetylene and $H_2$ may be used in particular.

In some implementations, formation of the first reaction layer 200 and the second reaction layer 300 using the physical vapor deposition process may be as follows: the first reaction layer 200 and the second reaction layer 300 are formed in the same machine, in order to avoid the influence of the external environment on the deposited film layer. Undoubtedly, the first reaction layer 200 and the second reaction layer 300 may also be formed in different machines in a stepwise manner.

In an implementation, the second reaction layer 300 may have a thickness ranging from 10 nm to 50 nm, e.g., 20 nm, 25 nm, 30 nm, 35 nm, 40 nm, 45 nm, etc.

In an implementation, the ratio of the thickness of the first reaction layer 200 to the thickness of the second reaction layer 300 may range from 1:0.5 to 1:4. Within this range, the amorphous diffusion barrier layer 400 that is attained later has a uniform thickness and a small thickness error range.

Figure 5:
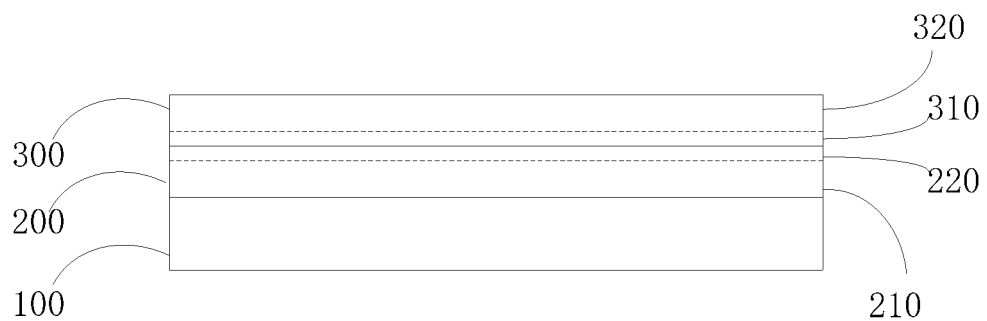

As shown in the step 1040 of FIG. 1 and in FIG. 5, at least a portion of the first reaction layer 200 is thermally reacted with at least a portion of the second reaction layer 300, to form an amorphous diffusion barrier layer.

As shown in FIG. 5, the first reaction layer 200 includes a first portion 210 and a second portion 220, and the first portion 210 and the second portion 220 are stacked along a thickness direction of the first reaction layer 200. The first portion 210 is a portion that does not react with the second reaction layer 300, and the second portion 220 is a portion that reacts with the second reaction layer 300.

The second reaction layer 300 includes a first portion 310 and a second portion 320, and the first portion 310 and the second portion 320 are stacked along the thickness direction of the second reaction layer 300. The first portion 310 is a portion that reacts with the second portion 220 of the first reaction layer 200, and the second portion 320 is a portion that does not react with the first reaction layer 200.

When the semiconductor structure is subjected to thermal treatment, the metal atoms (such as cobalt) of the second reaction layer 300 will diffuse towards the first reaction layer 200 (such as titanium nitride), so as to form the above-mentioned amorphous diffusion barrier layer 400. It is to be understood that the thickness of the amorphous diffusion barrier layer 400 may be less than or equal to the sum of the thickness of the second portion 220 of the first reaction layer 200 and the thickness of the first portion 310 of the second reaction layer 300. In some implementations, the thickness of the amorphous diffusion barrier layer 400 may range from 2 nm to 10 nm.

In some implementations, the above-mentioned amorphous diffusion barrier layer 400 may be formed by reacting the metal compound material of the first reaction layer 200 with the metal conductive material of the second reaction layer 300. In some implementations, the amorphous diffusion barrier layer 400 may include cobalt titanium nitride (CoTiN), which is an amorphous body with no grain boundary therein. As a result, the diffusion path for metal atoms is cut off, thereby improving the barrier effect of the barrier layer efficiently and solving the circuit performance issue caused by metal atom diffusion.

In some implementations, the thermal reaction described above is rapid thermal annealing. The temperature of the rapid thermal annealing may range from 200° C. to 1000° C., and may be 300° C., 450° C., 550° C., 650° C., or 800° C., for example. The time of the rapid thermal annealing may range from 1 s to 3 min, and may be 10 s, 30 s, 60 s, 90 s, 120 s, or 150 s, for example.

Figure 6:
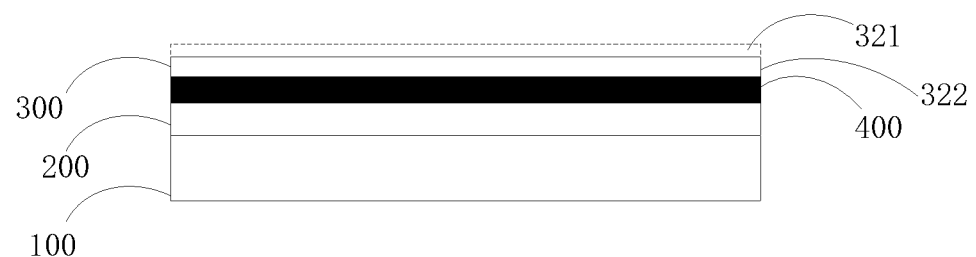

As shown in the step 1050 of FIG. 1 and in FIG. 6, a portion 321 of the second portion 320 of the second reaction layer 300 is removed along a thickness direction. Without varying the thickness of the amorphous diffusion barrier layer 400, the thicknesses of the first reaction layer 200 and the second reaction layer 300 can be effectively decreased by removing a part of the unreacted region of the second reaction layer 300. This further contributes to reducing the critical size of the semiconductor device.

In some implementations, removal of the portion 321 of the second portion 320 of the second reaction layer 300 may be achieved using a chemical mechanical polishing process, a grinding process, an etching process, a dry polishing process, wet cleaning, one or more other suitable processes, or combinations of the above.

In an implementation, the wet cleaning process is employed to remove the portion 321 of the second portion 320 of the second reaction layer 300. In particular, removal is done using a mixed liquid of sulfuric acid and hydrogen peroxide. The mixed liquid of sulfuric acid and hydrogen peroxide may have the volume ratio of concentrated sulfuric acid, hydrogen peroxide and water of 5:1:1. The cleaning temperature may range from 70° C. to 90° C., and the cleaning time may range from 10 s to 5 min.

A portion 322 that is left after the portion of the second portion 320 of the second reaction layer 300 is removed may serve as an adhesion layer or a seed layer for formation of a conductive layer 500 in the step 1060 of FIG. 1.

In an implementation, the thickness of the portion 322 that is left after the portion of the second portion 320 of the second reaction layer 300 is removed may range from 5 nm to 50 nm, and may be 8 nm, 10 nm, 15 nm, 25 nm, or 40 nm, for example.

Figure 7:
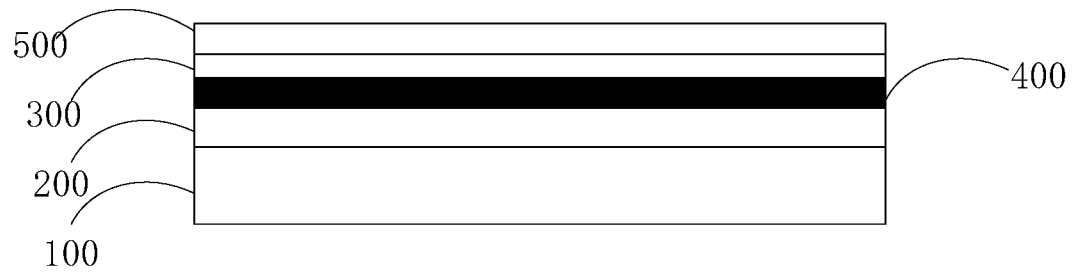

As shown in the step 1060 of FIG. 1 and in FIG. 7, a conductive layer 500 is formed on the second reaction layer 300. In some implementations, the conductive layer 500 is made of or includes a metal material. The metal material may include tungsten, aluminum, copper, one or more other suitable materials, or combinations of the above. The conductive layer 500 may be deposited on the second reaction layer 300, and deposition of the conductive layer 500 may be achieved using chemical vapor deposition, atomic layer deposition, physical vapor deposition, plasma-assisted chemical vapor deposition, electroplating, electroless plating, spin coating, one or more other suitable processes, or combinations of the above.

In some implementations, the conductive layer 500 is made of copper, the first reaction layer 200 is made of a metal compound material, e.g., TiN, and the second reaction layer 300 is made of a metal conductive material, e.g., Co. In some other implementations, the conductive layer 500 is made of tungsten, the first reaction layer 200 is made of a metal conductive material e.g., Co, and the second reaction layer 300 is made of a metal compound material, e.g., TiN.

The semiconductor structure manufacturing method according to another implementation of the present application will be described in detail below with reference to FIG. 8 to FIG. 13. In these drawings, FIG. 8 illustrates a flow chart of the semiconductor structure manufacturing method according to another embodiment of the present application, and FIG. 9 to FIG. 13 illustrate sectional diagrams of different process stages of the semiconductor structure manufacturing method according to another embodiment of the present application.

Figure 8:
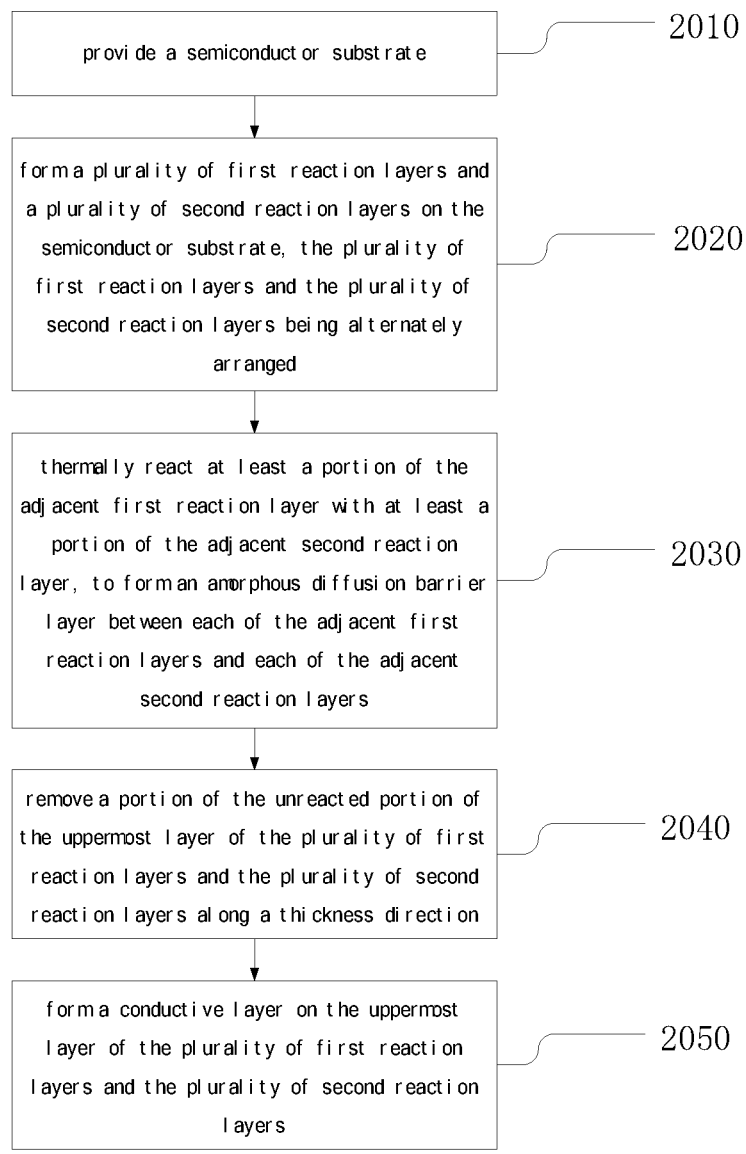
FIG. 8 illustrates a flow chart of the semiconductor structure manufacturing method according to another embodiment of the present application.
Figure 9:
FIG. 9 to FIG. 13 illustrate sectional diagrams of different process stages of the semiconductor structure manufacturing method according to another embodiment of the present application.

As shown in the step 2010 of FIG. 8 and in FIG. 9, a semiconductor substrate 100 is provided. The semiconductor substrate 100 may be a plane (planar metal gate) as shown in the drawing, and may be of a trench type (buried wordline) or hole type structure (metal interconnecting structure). The semiconductor substrate 100 includes a semiconductor material such as matrix silicon or monocrystalline silicon. In other embodiments or additional embodiments, the semiconductor substrate 100 may include another semiconductor element, such as germanium with a crystalline structure. The semiconductor substrate 100 may also include semiconductor compounds, such as silicon germanium, silicon carbide, gallium arsenide, gallium phosphide, indium phosphide, indium arsenide, indium antimonide, or combinations thereof. The semiconductor substrate 100 may also include a semiconductor-on-insulator substrate 100, such as silicon-on-insulator substrate, silicon germanium-on-insulator substrate, or germanium-on-insulator substrate.

In some embodiments, the semiconductor substrate 100 is a bulk semiconductor substrate 100, e.g., semiconductor wafer. For example, the semiconductor substrate 100 includes a semiconductor material of silicon or other elements, e.g., germanium. The semiconductor substrate 100 may be doped (e.g., P-type, N-type, or combinations of the above) or undoped. In some embodiments, the semiconductor substrate 100 includes a semiconductor layer growing epitaxially on a dielectric layer. The epitaxially growing semiconductor layer may be made of silicon germanium, silicon, germanium, one or more other suitable materials, or combinations of the above.

In some other embodiments, the semiconductor substrate 100 includes a compound semiconductor. For example, the compound semiconductor includes one or more Group III-V compound semiconductors having a composition as defined in the formula $Al_{X1}Ga_{X2}In_{X3}As_{Y1}P_{Y2}N_{Y3}Sb_{Y4}$, where X1, X2, X3, Y1, Y2, Y3 and Y4 represent relative proportions. They are each more than or equal to 0, and their sum is equal to 1. The compound semiconductor may include silicon carbide, gallium arsenide, indium arsenide, indium phosphide, one or more other suitable compound semiconductors, or combinations of the above. Other suitable substrates including Group II-VI compound semiconductors may also be used.

In some embodiments, the semiconductor substrate 100 is an active layer of a semiconductor-on-insulator (SOI) substrate. The manufacturing of the SOI substrate may be achieved using a separation by implantation of oxygen (SIMOX) process, a wafer bonding process, other suitable processes, or combinations of the above. In some other embodiments, the semiconductor substrate 100 includes a multilayer structure. For instance, the semiconductor substrate 100 includes a silicon germanium layer formed on a bulk silicon layer.

Figure 10:

As shown in the step 2020 of FIG. 8 and in FIG. 10, a plurality of first reaction layers 200 and a plurality of second reaction layers 300 are formed on the semiconductor substrate 100, and the plurality of first reaction layers 200 and the plurality of second reaction layers 300 are alternately arranged.

In some implementations, the first reaction layer 200 is a made of metal compound material. In some implementations, the above metal compound material may include titanium nitride (TiN), tantalum nitride (TaN), titanium carbonitride (TiCN), or tantalum carbonitride (TaCN).

In an implementation, when titanium nitride (TiN) is formed on the semiconductor substrate 100, atomic layer deposition, chemical vapor deposition, plasma-assisted chemical vapor deposition, physical vapor deposition (PVD), electroplating, electroless plating, one or more other suitable processes, or combinations of the above may be used to deposit a TiN layer on the semiconductor substrate 100.

In some implementations, the physical vapor deposition process is utilized to deposit the TiN layer on the semiconductor substrate 100, and the reaction gas for TiN may be $TiCl_4$ and $NH_3$.

In an implementation, the first reaction layer 200 may have a thickness ranging from 2 nm to 10 nm, e.g., 3 nm, 5 nm, 7 nm, 9 nm, etc.

In some implementations, the second reaction layer 300 is made of a metal conductive material, which may be cobalt (Co), molybdenum (Mo), tungsten (W) or iridium (Ir), or combinations thereof.

In an implementation, formation of a cobalt layer on the first reaction layer 200 may be achieved using chemical vapor deposition, atomic layer deposition, physical vapor deposition, plasma-assisted chemical vapor deposition, electroplating, electroless plating, spin coating, one or more other suitable processes, or combinations of the above.

In some implementations, when the physical vapor deposition process is employed to deposit Co on the first reaction layer 200, dicobalt hexacarbonyl butylacetylene and $H_2$ may be used in particular.

In some implementations, formation of the first reaction layer 200 and the second reaction layer 300 using the physical vapor deposition process may be as follows: the first reaction layer 200 and the second reaction layer 300 are formed in the same machine, in order to avoid the influence of the external environment on the deposited film layer. Undoubtedly, the first reaction layer 200 and the second reaction layer 300 may also be formed in different machines in a stepwise manner.

In an implementation, the second reaction layer 300 may have a thickness ranging from 2 nm to 10 nm, e.g., 3 nm, 5 nm, 7 nm, 9 nm, etc.

In an implementation, the ratio of the thickness of the first reaction layer 200 to the thickness of the second reaction layer 300 may range from 1:0.5 to 1:4. Within this range, the amorphous diffusion barrier layer 400 that is attained later has a uniform thickness and a small thickness error range.

The above operation of depositing the first reaction layers 200 and the second reaction layers 300 is repeated, and a plurality of first reaction layers 200 and second reaction layers 300 arranged alternately are formed on the semiconductor substrate 100 (e.g., TiN/Co/TiN/Co/TiN/Co . . . ).

Figure 11:
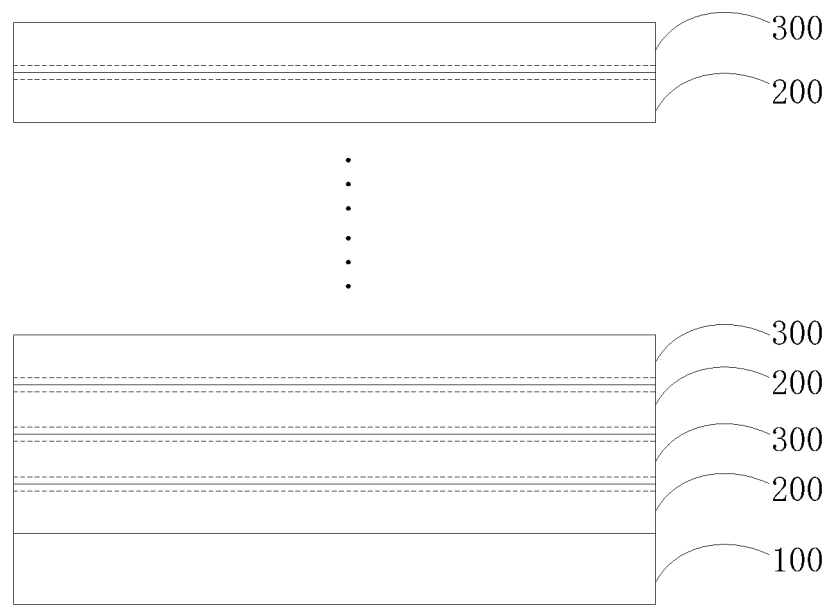

As shown in the step 2030 of FIG. 8 and in FIG. 11, at least a portion of the adjacent first reaction layer 200 is thermally reacted with at least a portion of the adjacent second reaction layer 300, to form an amorphous diffusion barrier layer 400 between each of the adjacent first reaction layers 200 and each of the adjacent second reaction layers 300.

As shown in FIG. 11, the plurality of first reaction layers 200 and the plurality of second reaction layers 300 are alternately arranged, to form an amorphous diffusion barrier layer 400 between each of the adjacent first reaction layers 200 and each of the adjacent second reaction layers 300. As such, a plurality of amorphous diffusion barrier layers 400 are formed in the semiconductor structure, and the barrier effect of the barrier layers are improved.

When the semiconductor structure is subjected to thermal treatment, the metal atoms (such as cobalt) of the second reaction layer 300 will diffuse towards two first reaction layers 200 (such as titanium nitride) adjacent thereto, so as to form the above-mentioned amorphous diffusion barrier layer 400. In some implementations, the thickness of the amorphous diffusion barrier layer 400 may range from 1 nm to 5 nm.

In some implementations, the above-mentioned amorphous diffusion barrier layer 400 may be formed by reacting the metal compound material of the first reaction layer 200 with the metal conductive material of the second reaction layer 300. In some implementations, the amorphous diffusion barrier layer 400 may include cobalt titanium nitride (CoTiN), which is an amorphous body with no grain boundary therein. As a result, the diffusion path for metal atoms is cut off, thereby improving the barrier effect of the barrier layers efficiently and solving the circuit performance issue caused by metal atom diffusion.

In some implementations, the thermal reaction described above is rapid thermal annealing. The temperature of the rapid thermal annealing may range from 200° C. to 1000° C., and may be 300° C., 450° C., 550° C., 650° C., or 800° C., for example. The time of the rapid thermal annealing may range from 1 s to 3 min, and may be 10 s, 30 s, 60 s, 90 s, 120 s, or 150 s, for example.

Figure 12:
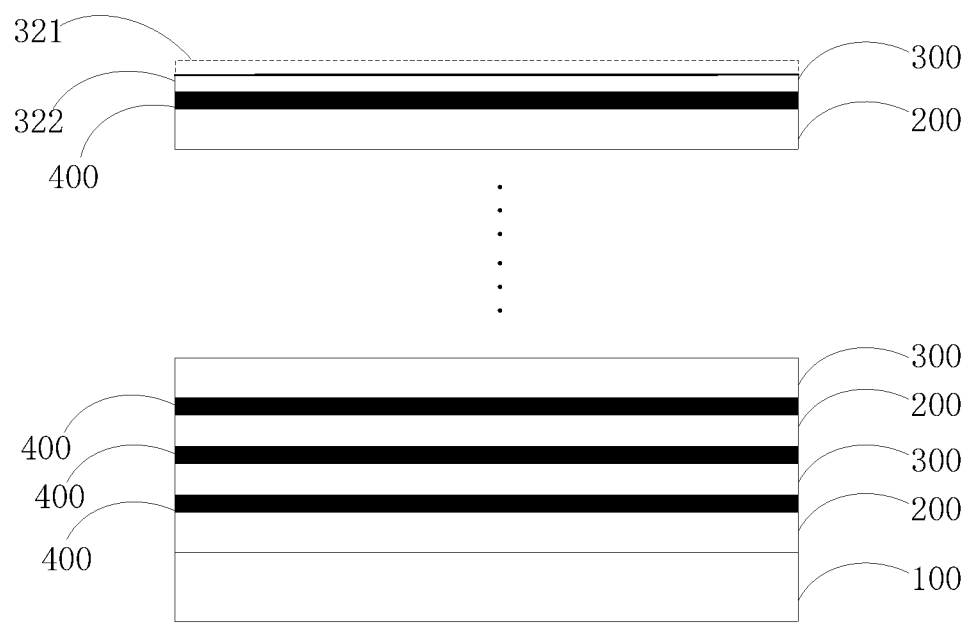

As shown in the step 2040 of FIG. 8 and in FIG. 12, a portion 321 of the unreacted portion of the uppermost layer of the plurality of first reaction layers 200 and the plurality of second reaction layers 300 is removed along a thickness direction. Without varying the thickness of the amorphous diffusion barrier layer 400, the thicknesses of the plurality of first reaction layers 200 and the plurality of second reaction layers 300 can be effectively decreased by removing a part of the unreacted region of the uppermost layer. This further contributes to reducing the critical size of the semiconductor device.

In some implementations, removal of the portion 321 of the unreacted portion of the uppermost layer may be achieved using a chemical mechanical polishing process, a grinding process, an etching process, a dry polishing process, wet cleaning, one or more other suitable processes, or combinations of the above.

In an implementation, the wet cleaning process is employed to remove the portion 321 of the unreacted portion of the uppermost layer. In particular, removal is done using a mixed liquid of sulfuric acid and hydrogen peroxide. The mixed liquid of sulfuric acid and hydrogen peroxide may have the volume ratio of concentrated sulfuric acid, hydrogen peroxide and water of 5:1:1. The cleaning temperature may range from 70° C. to 90° C., and the cleaning time may range from 10 s to 5 min.

A portion 322 that is left after the portion of the unreacted region of the uppermost layer is removed may serve as an adhesion layer or a seed layer for formation of a conductive layer 500 in the step 2050 of FIG. 8.

For example, the amorphous diffusion barrier layer 400 may include cobalt titanium nitride (CoTiN), the first reaction layer 200 may include TiN, and the second reaction layer 300 may include Co. The uppermost layer of the plurality of first reaction layers 200 and the plurality of second reaction layers 300 may be the second reaction layer 300, e.g., Co. The portion 322 that is left after the portion of the unreacted region of the second reaction layer 300 is removed may serve as an adhesion layer or a seed layer for subsequent copper deposition.

Certainly, it will be appreciated that the uppermost layer of the plurality of first reaction layers 200 and the plurality of second reaction layers 300 may also be the first reaction layer 200, e.g., TiN, which may serve as an adhesion layer and a barrier layer for subsequent tungsten deposition. Therefore, CoTiN may serve as an adhesion layer and a barrier layer at the time of tungsten deposition, in order to block erosion of the semiconductor substrate 100 caused by fluorine (F) atoms in tungsten.

In an implementation, the thickness of the portion that is left after the portion of the unreacted region of the uppermost layer is removed may range from 2 nm to 10 nm, and in particular may be 4 nm, 6 nm, or 8 nm.

Figure 13:
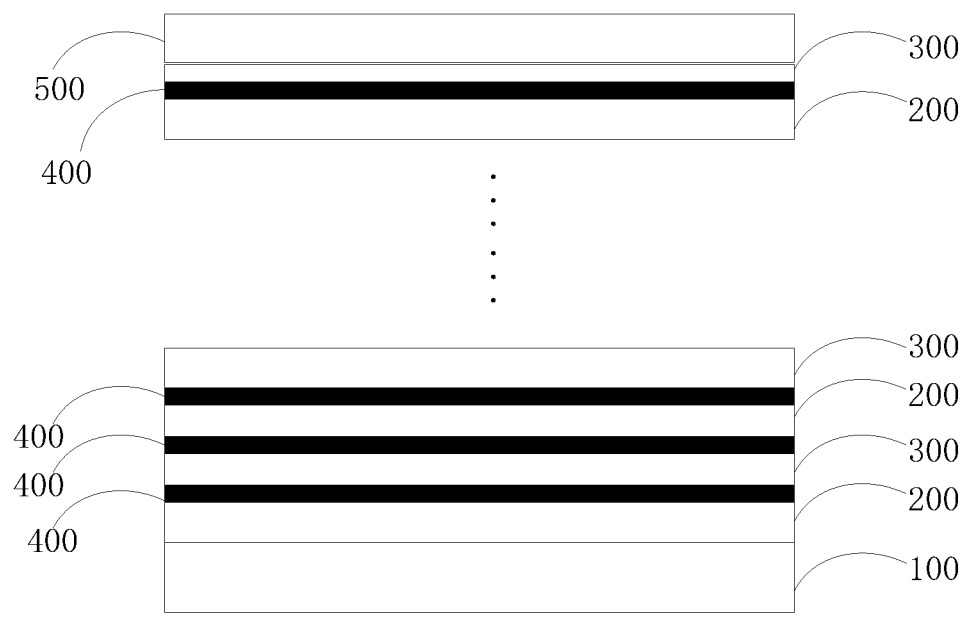

As shown in the step 2050 of FIG. 8 and in FIG. 13, a conductive layer 500 is formed on the uppermost layer of the plurality of first reaction layers 200 and the plurality of second reaction layers 300. In some implementations, the conductive layer 500 is made of or includes a metal material. The metal material may include tungsten, aluminum, copper, one or more other suitable materials, or combinations of the above. The conductive layer 500 may be deposited using chemical vapor deposition, atomic layer deposition, physical vapor deposition, plasma-assisted chemical vapor deposition, electroplating, electroless plating, spin coating, one or more other suitable processes, or combinations of the above.

In conclusion, the semiconductor structure manufacturing method according to the embodiments of the present application has the following advantages and beneficial effects.

In the semiconductor structure manufacturing method according to the embodiments of the present application, the first and second reaction layers are formed respectively on the semiconductor substrate and then undergo a thermal reaction to form an amorphous diffusion barrier layer between the first and second reaction layers. This amorphous diffusion barrier layer is an amorphous body with no grain boundary therein. As a result, the diffusion path for metal atoms is cut off, thereby improving the barrier effect of the barrier layer efficiently and solving the circuit performance issue caused by metal atom diffusion.

In addition, after the amorphous diffusion barrier layer is formed by the thermal reaction, the second reaction layer has not fully reacted with the first reaction layer, and there is still an unreacted region on the upper portion of the second reaction layer. Without varying the thickness of the amorphous diffusion barrier layer, the thicknesses of the first reaction layer and the second reaction layer can be effectively decreased by removing a part of the unreacted region of the second reaction layer. This further contributes to reducing the critical size of the semiconductor device.

It is to be noted herein that the semiconductor structure manufacturing method shown in the drawings and described in this specification is merely an example of use of the principle of the present application. Those ordinary skilled in the art shall clearly understand that the principle of the present application is not limited only to any details or any components of the device shown in the drawings or described in the specification.

It should be understood that the present application does not limit its application to the detailed structure and arrangement of the components proposed in this specification. The present application can have other implementations, and can be implemented and executed in various ways. The aforementioned deformations and modifications fall within the scope of the present application. It should be understood that the present application disclosed and defined in this specification extends to all alternative combinations of two or more than two individual features that are mentioned or

What is claimed is:

1. A semiconductor structure manufacturing method, comprising the following steps of:
   providing a semiconductor substrate;
   forming a first reaction layer on the semiconductor substrate;
   forming a second reaction layer on the first reaction layer; and
   thermally reacting at least a portion of the first reaction layer with at least a portion of the second reaction layer, to form an amorphous diffusion barrier layer;
   wherein, a first portion of the second reaction layer thermally reacts with the first reaction layer, a second portion of the second reaction layer does not thermally react with the first reaction layer; and the method further comprises:
      forming a conductive layer on the second portion, the second portion being an adhesion layer or a seed layer for the conductive layer;
   wherein, before forming the conductive layer on the second portion, the method further comprises:
      removing a portion of the second portion along a thickness direction; and
   wherein a ratio of a thickness of the first reaction layer to a thickness of the second reaction layer ranges from 1:0.5 to 1:4.

2. The semiconductor structure manufacturing method according to claim 1, wherein one of the first reaction layer and the second reaction layer is made of a metal conductive material, and the other of the first reaction layer and the second reaction layer is made of a metal compound material;
   the amorphous diffusion barrier layer is formed by reacting the metal conductive material with the metal compound material.

3. The semiconductor structure manufacturing method according to claim 2, wherein the metal conductive material comprises Co and the metal compound material comprises TiN.

4. The semiconductor structure manufacturing method according to claim 1, wherein the thermally reacting comprises rapid thermal annealing.

5. The semiconductor structure manufacturing method according to claim 2, wherein the thermally reacting comprises rapid thermal annealing.

6. The semiconductor structure manufacturing method according to claim 3, wherein the thermally reacting comprises rapid thermal annealing.

7. The semiconductor structure manufacturing method according to claim 1, wherein the amorphous diffusion barrier layer has a thickness ranging from 2 nm to 20 nm.

8. A semiconductor structure manufacturing method, comprising the following steps of:
   providing a semiconductor substrate;
   forming a plurality of first reaction layers and a plurality of second reaction layers on the semiconductor substrate, the plurality of first reaction layers and the plurality of second reaction layers being alternately arranged;
   thermally reacting at least a portion of each of the plurality of first reaction layers with at least a portion of each of the plurality of second reaction layers adjacent to at least one of the plurality of first reaction layers, to form an amorphous diffusion barrier layer between each adjacent first reaction layer and each adjacent second reaction layer; and
   forming a conductive layer on an unreacted region of an uppermost layer of the plurality of first reaction layers and the plurality of second reaction layers, the unreacted region being an adhesion layer or a seed layer for the conductive layer;
   wherein, before forming the conductive layer on the unreacted region of the uppermost layer, the method further comprises:
      removing a portion of the unreacted region along a thickness direction; and
   wherein a ratio of a thickness of each of the plurality of first reaction layers to a thickness of each of the plurality of second reaction layers ranges from 1:0.5 to 1:4.

9. The semiconductor structure manufacturing method according to claim 8, wherein one of the plurality of first reaction layers and the plurality of second reaction layers is made of a metal conductive material, and the other of the plurality of first reaction layers and the plurality of second reaction layers is made of a metal compound material;
   the amorphous diffusion barrier layer is formed by reacting the metal conductive material with the metal compound material.

10. The semiconductor structure manufacturing method according to claim 9, wherein the metal conductive material comprises Co and the metal compound material comprises TiN.

* * * * *